United States Patent [19]
Ghahghahi

[11] Patent Number: 6,150,729
[45] Date of Patent: Nov. 21, 2000

[54] ROUTING DENSITY ENHANCEMENT FOR SEMICONDUCTOR BGA PACKAGES AND PRINTED WIRING BOARDS

[75] Inventor: Farshad Ghahghahi, Los Gatos, Calif.

[73] Assignee: LSI Logic Corporation, Milpitas, Calif.

[21] Appl. No.: 09/345,432

[22] Filed: Jul. 1, 1999

[51] Int. Cl.[7] .......................... H01L 23/48; H01L 23/52; H01L 29/40
[52] U.S. Cl. .......................... 257/786; 257/773; 257/698
[58] Field of Search ..................... 257/786, 774, 257/773, 699, 692; 361/792, 793, 795

[56] References Cited

U.S. PATENT DOCUMENTS

| | | |
|---|---|---|
| 5,450,290 | 9/1995 | Boyko et al. . |
| 5,625,944 | 5/1997 | Werther . |
| 5,650,660 | 7/1997 | Barrow . |
| 5,686,699 | 11/1997 | Chu et al. . |
| 5,686,764 | 11/1997 | Fulcher . |
| 5,903,051 | 5/1999 | Miks et al. . |
| 6,008,543 | 12/1999 | Iwabuchhi . |

*Primary Examiner*—Sheila V. Clark

[57] ABSTRACT

A routing scheme for a multilayer printed wiring board or semiconductor package is disclosed. Each of a first group of electrical contacts such as bond pads is disposed on a first surface and is electrically coupled to one of a plurality of conductive surface connectors such as vias. Each of a second group of electrical contacts is disposed on the first surface and is routed by one of a second plurality of traces. Each of a plurality of short traces couple each of the bond pads in the first group with corresponding ones of the vias, which in turn are electrically coupled to one of a plurality of first traces on the second surface. The orientation between certain electrical contacts in the first group and their associated vias is different than the orientation between certain other electrical contacts in the first group and their associated vias. This varying orientation allows greater routing density on the second surface.

11 Claims, 5 Drawing Sheets

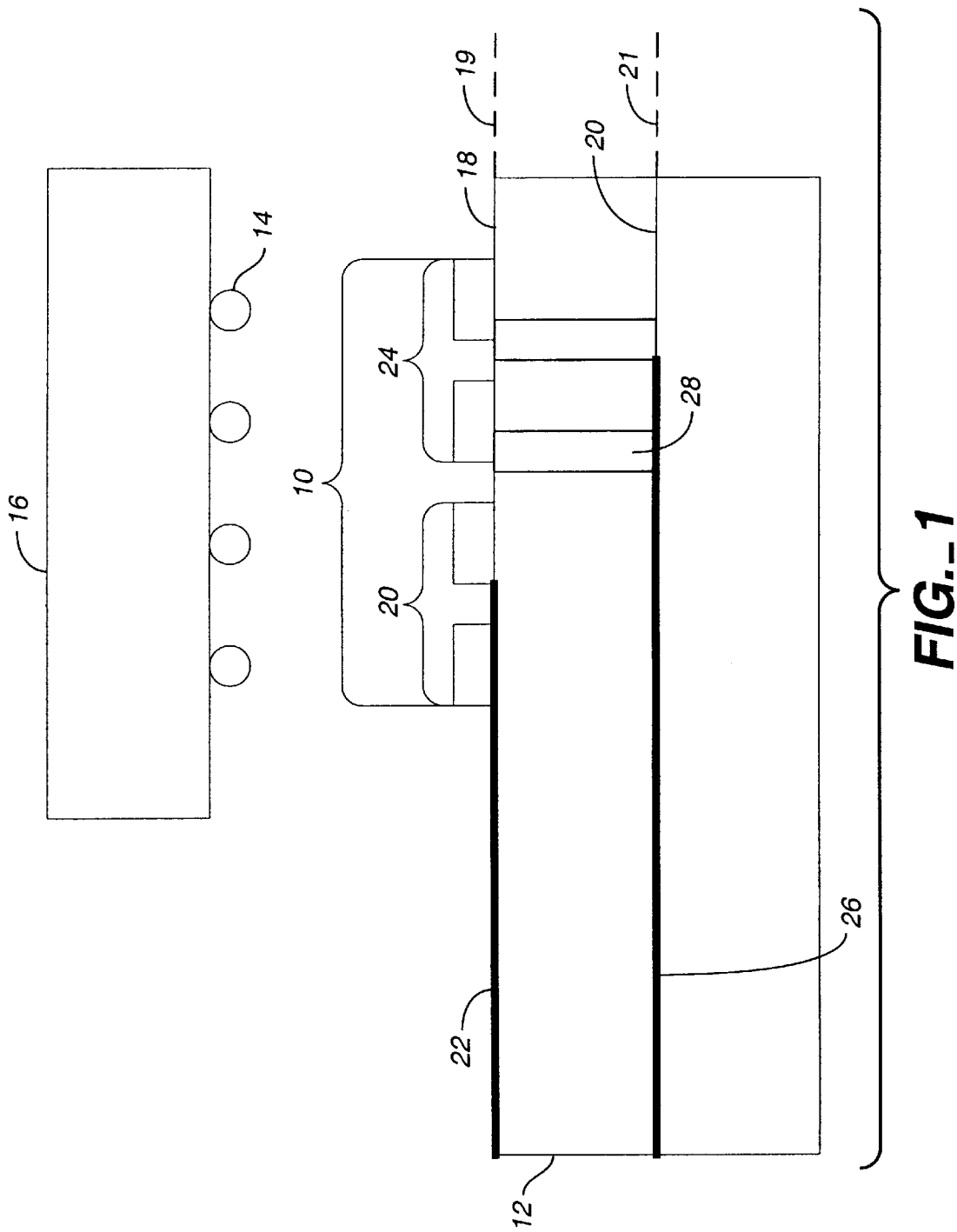
FIG._1

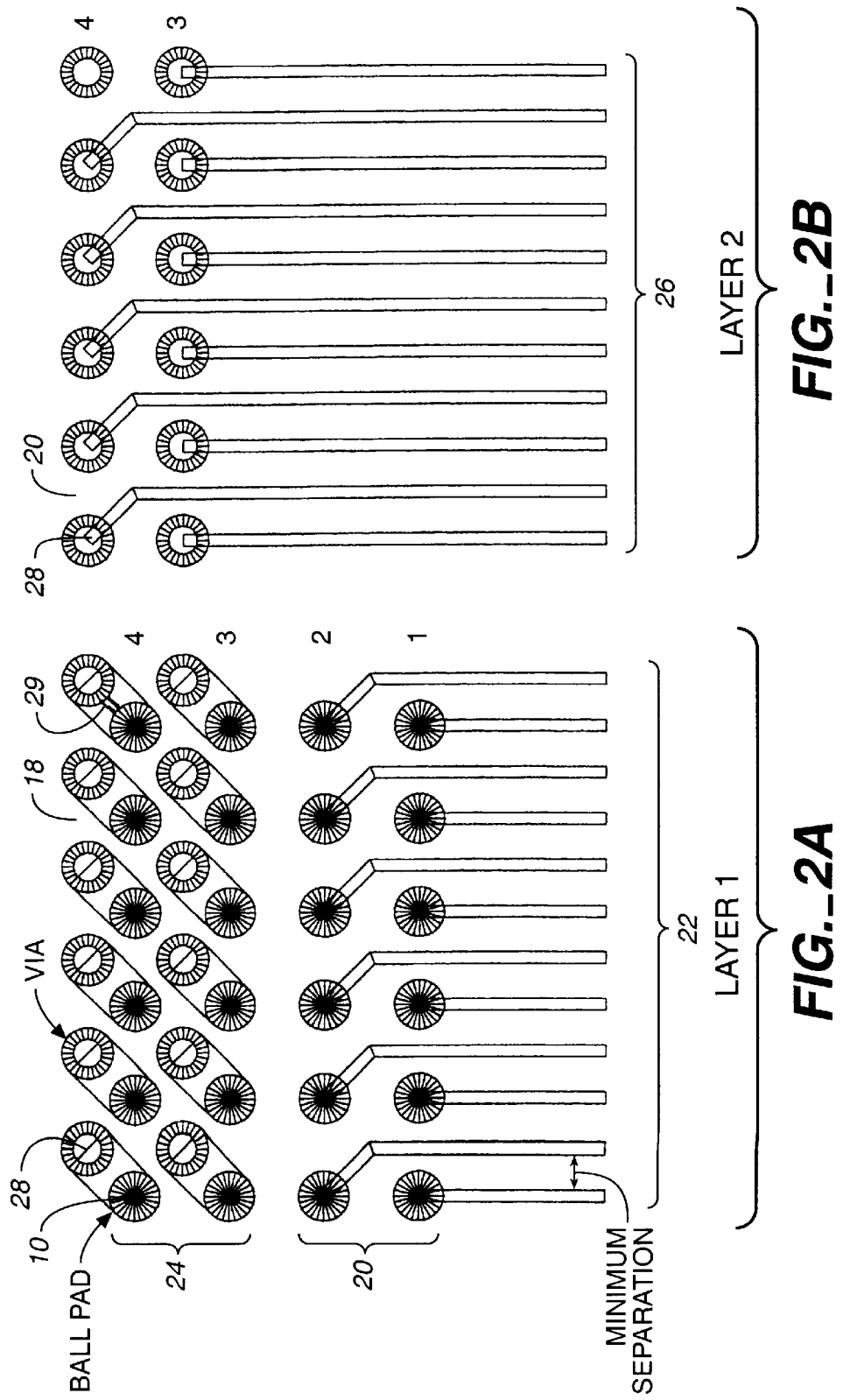

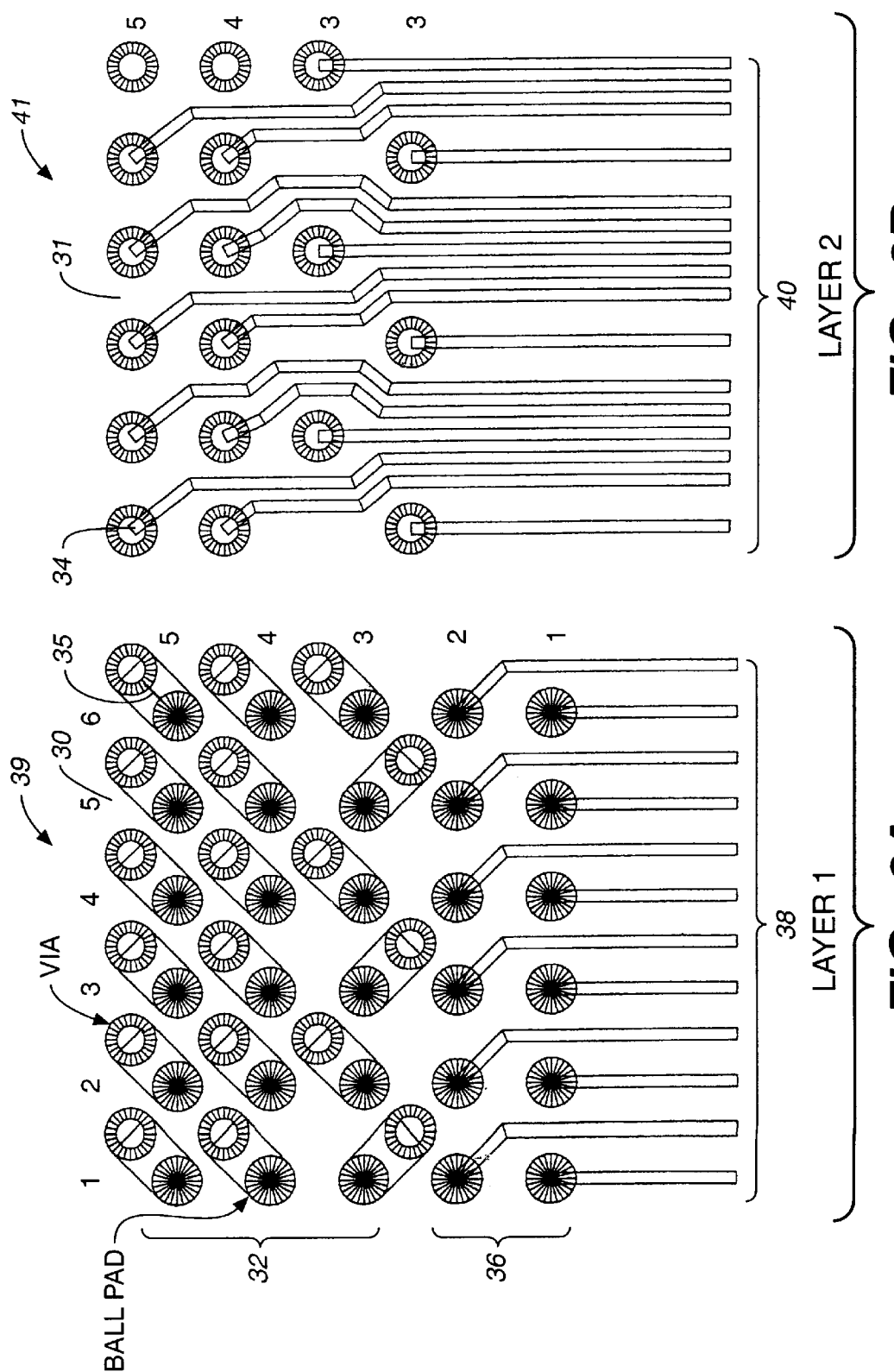

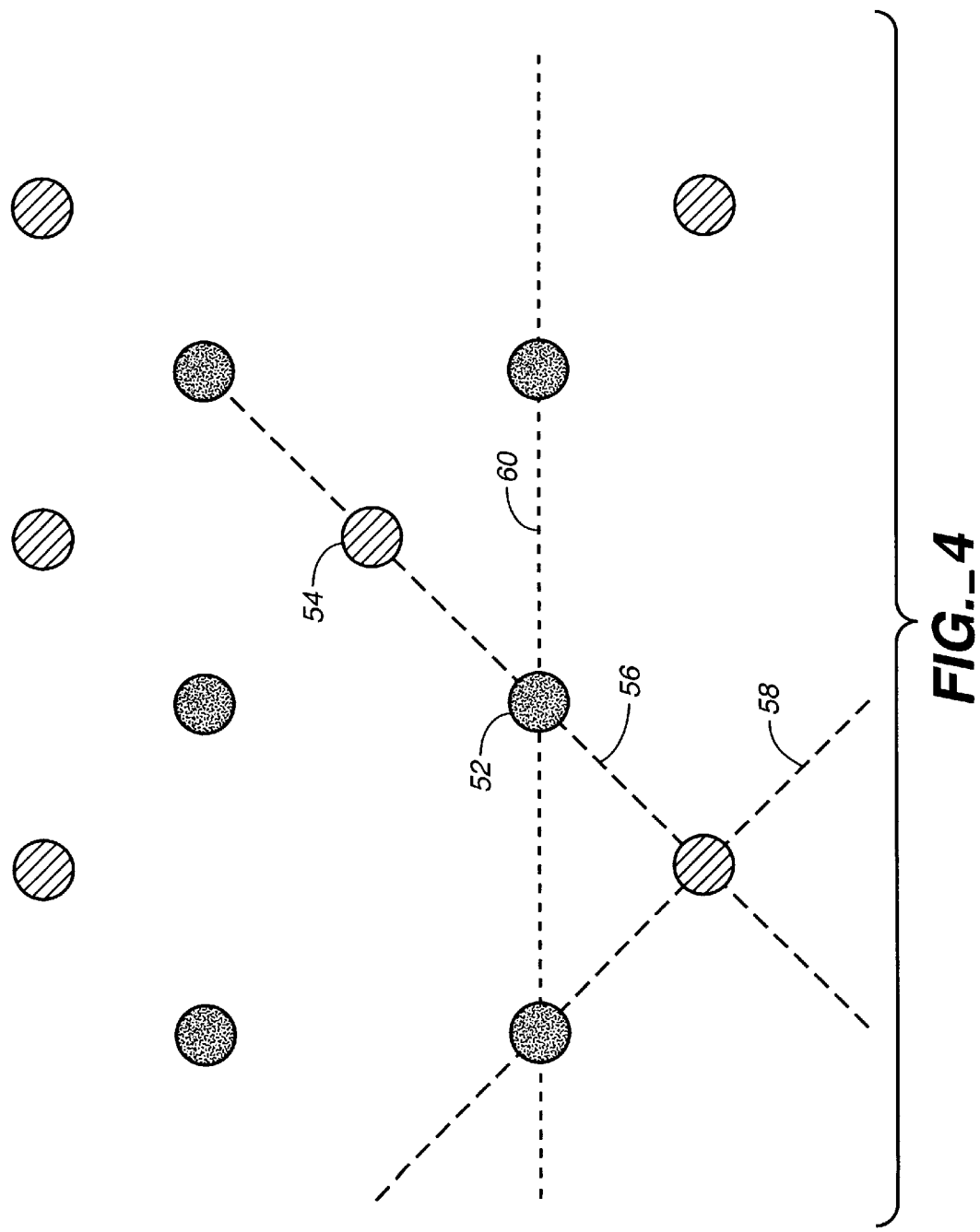

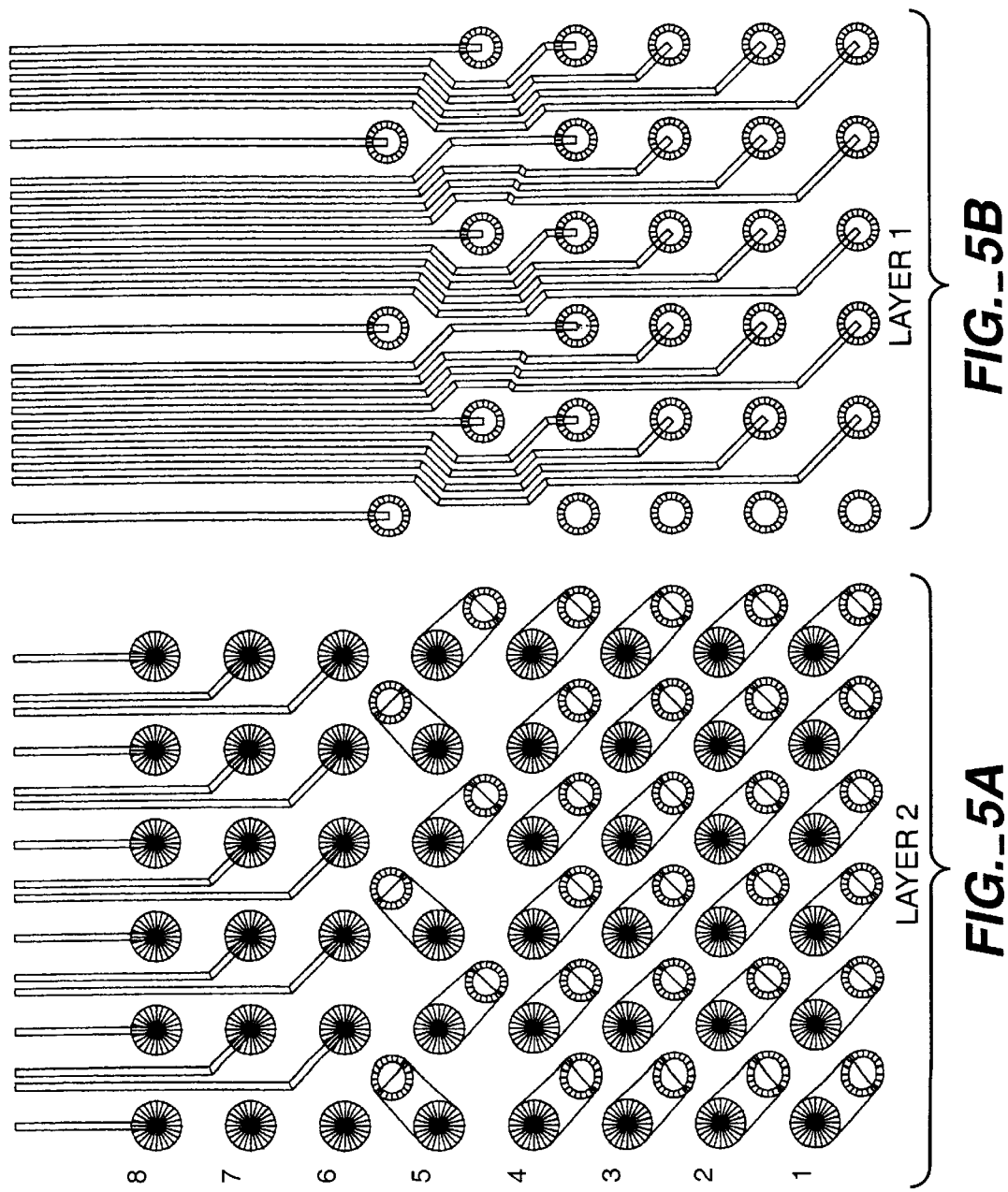

ROUTING DENSITY ENHANCEMENT FOR SEMICONDUCTOR BGA PACKAGES AND PRINTED WIRING BOARDS

BACKGROUND OF THE INVENTION

1. Field of the Invention

This invention relates to the packaging of semiconductor devices, and in particular to methods and apparatus for increasing the routing density of a ball grid array package, a printed wiring board or the like.

2. Description of the Related Art

As pin counts of chips increase, there is a concomitant need for packages that can connect these greater numbers of output leads to a printed wiring board (PWB). Similarly, there is a need for PWB's with increased routing density, especially considering the trend toward smaller and smaller devices (e.g. cell phones); for a given surface area of PWB, it is desirable to route as many wires as possible.

FIG. 1 shows a typical two surface routing scheme for a PWB. As shown, a plurality of ball pads 10 serves to electrically couple a PWB 12 with a plurality of solder balls 14 on a ball grid array (BGA) package 16. The PWB comprises a substrate with two surfaces, 18 and 20, which are located on first and second planes, 19 and 21, which are parallel to one another. The plurality of ball pads 10 are on surface 18. A first group 20 of the plurality of ball pads 10 is routed by traces 22 on surface 18 while a second group 24 of the plurality of ball pads 10 is routed by traces 26 on surface 20. Each of a plurality of short traces 29 (see FIG. 2a) electrically couples a corresponding one of the second group 24 with a corresponding one of a plurality of vias 28, which in turn is connected to a corresponding one of the traces 26 on surface 20.

As can be seen by referring to FIGS. 2a and 2b, spacing constraints between traces prevent all the plurality of solder ball pads 10 from being routed on the same surface; thus, the two (or more) level routing scheme is required for the that is routed as shown in FIGS. 2a and 2b. FIG. 2a shows the routing scheme for surface 18 while FIG. 2b shows the routing scheme for surface 20. As shown in FIG. 2a, the distance between the traces 22 must exceed a certain threshold. (The same holds true for the traces 26 in FIG. 2b). Therefore, given the area of surface 18, the second group of ball pads 24 could not be routed on surface 18. Instead, each of the vias 28 connects one of the second group of ball pads 24 to the traces 26 on surface 20. The vias 28 are arranged in a grid like structure; that is, the orientation between each of the vias 28 and its respective ball pad is constant.

For a printed circuit board (or substrate etc.) with a given surface area, it is desirable to increase, relative to the scheme shown in FIG. 1, the number of ball pads (or solder balls etc.) that can be routed.

SUMMARY OF THE INVENTION

These needs are met by a multilayer PWB according to the present invention. Each of a first group of electrical contacts such as bond pads is disposed on a first surface and is electrically coupled to one of a plurality of conductive surface connectors such as vias. Each of a second group of electrical contacts is disposed on the first surface and is routed by one of a second plurality of traces. Each of a plurality of short traces couple each of the bond pads in the first group with corresponding ones of the vias, which in turn are electrically coupled to one of a plurality of first traces on the second surface. The orientation between certain electrical contacts in the first group and their associated vias is different than the orientation between certain other electrical contacts in the first group and their associated vias. This varying orientation allows greater routing density on the second surface.

BRIEF DESCRIPTION OF THE DRAWINGS

Other objects and advantages of the invention will become apparent upon reading the following detailed description and upon reference to the accompanying drawings in which:

FIG. 1 is a side view of a two layer PWB.

FIGS. 2a and 2b, respectively, show a conventional wire routing scheme for each of the two layers of the PWB shown in FIG. 1.

FIGS. 3a and 3b, respectively, show a wire routing scheme according to an embodiment of the present invention for each of the two layers of the PWB shown in FIG. 1.

FIG. 4 is a simplified view of a portion of FIG. 3a, illustrating some of the geometrical relationships between electrical contacts and corresponding vias.

FIGS. 5a and 5b respectively, show a wire routing scheme according to an alternate embodiment of the present invention for each of the two layers of the PWB shown in FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIGS. 3a and 3b, respectively, show a routing schemes for a first surface 30 and a second surface 31 of a two surface PWB such as that shown in FIG. 1. The first surface 30 and the second surface 31, respectively, lie on planes 39 and 41, respectively; in the preferred embodiment, planes 39 and 41 are parallel to one another since these planes correspond to planes 19 and 21 of FIG. 1. It will be readily appreciated that the present invention may be used for any number of surfaces and in contexts other than PWB routing (for example, without limitation, ball grid array routing).

As shown in FIG. 3a, each of a first group of electrical contacts (bond pads) 32 is electrically coupled to one of a plurality of conductive surface connectors (vias) 34. Each of a second group of electrical contacts (bond pads) 36 is routed by one of a second plurality of traces 38. Each of a plurality of short traces 35 couple each of the bond pads in the first group 32 with a corresponding one of the vias 34, which in turn is electrically coupled to a corresponding one of a plurality of first traces 40 on the second surface 32. (It will be appreciated that the vias 34 need not end on the same surface; that is, different groups' vias 34 could connect to a corresponding one of a plurality of surfaces. This scheme would make sense, for example, in a PWB with surfaces having different surface areas.)

As shown in FIG. 3a, the bond pads 32 are arranged in a grid of evenly spaced rows and columns comprising rows 1 through 5 and columns 1–6. (It will be appreciated, however, that the present invention is not limited to grid type layouts).

In rows 1 and 2, the orientation between each of the vias 34 and its corresponding one of the bond pads 32 is identical. In row 3, however, the orientation of the vias 34 in columns 1, 3, and 5 is different than the orientation of the vias in columns 2, 4 and 6.

This altered orientation results in a greater pitch (distance) between certain of the vias 34 which in turn means that more of the first plurality of traces 40 may be routed between these vias 34. In particular, as shown in FIG. 3*b*, two traces, 40*a* and 40*b*, may be routed between vias 34*a* and 34*b*. This extra spacing allows an extra row (row 3) of bond pads 32 to be routed in the second surface 21, compared with the prior art technique as shown in FIGS. 2*a* and 2*b* (assuming that the PWB surface area in those Figures is the same as the surface are of the PWB shown in FIGS. 3*a* and 3*b*).

FIG. 4 shows the geometrical features of the layout of FIG. 3*a*. FIG. 4 shows columns 1–3 of rows 3 and 4 of FIG. 3*a*; the remaining rows and columns have been omitted for the purposes of illustration. As shown in FIG. 4, electrical contacts that are a subset of the first group of electrical contacts 32 and each of the plurality of vias 34 has a geometric center located a corresponding point on the first surface 30, shown as points 52 and 54 respectively. The geometric center of a bond pad and its associated vias defines a line, such as line 56 or line 58.

Lines corresponding to bond pads in columns 2, 4, and 6 of row 3 (third group of bond pads) are all parallel to one another and intersect lines corresponding to bond pads in columns 1, 3, and 5 of row 3 (fourth group of bond pads) at an angle of 90 degrees, which is shown in FIG. 4 as the angle between the intersection of line 56 and line 58. Also, as shown, lines corresponding to the third group of bond pads 52, such as line 56 intersect any line, such as line 60, parallel to row 3 (i.e. a line that passes through the geometric center of the bond pads in row 3) at an angle of 45 degrees. Lines corresponding to bond pads in the fourth group of bond pads 54, such as line 58, intersect any line parallel to row 3 at an angle of −45 degrees.

(In the above discussion, the smaller of the two angles between lines has been used. For example, 45 degrees has been used instead of 315 degrees. It will be readily appreciated that either measure may be used.)

FIGS. 5*a* and 5*b*, respectively, show first and second surfaces, routed in accordance with a preferred embodiment of the present invention, for a 6×8 array of bond pads.

Numerous variations and modifications will become apparent to those skilled in the art once the above disclosure is fully appreciated. For example, the angle between bond pad "lines" need not be 90 degrees. It is intended that the following claims be interpreted to embrace all such variations and modifications.

What is claimed is:

1. A device for routing a plurality of external electrical contacts, comprising:

a plurality of electrical contacts for coupling with the external electrical contacts, the plurality of electrical contacts disposed on a first surface lying on a first plane;

a first plurality of traces disposed on a second surface, the first surface lying on a second plane that is different from the first plane;

a plurality of surface connectors, each of the plurality of surface connectors connecting a corresponding one of a first group of the plurality of electrical contacts to a corresponding one of the first plurality of traces such that the first group of the plurality of electrical contacts is at least partially routed along the second surface;

a second plurality of traces disposed on the first surface, each of the second plurality of traces connected to a corresponding one of a second group of the plurality of electrical contracts, such that the second group of the plurality of electrical contacts is at least partially routed on the first surface;

a plurality of short traces disposed on the first surface, each of the plurality of short traces electrically coupling a corresponding one of the first group of the plurality of electrical contacts with a corresponding one of the plurality of surface connectors; wherein each of a plurality of lines is defined by the geometric center of a corresponding one of the first group of electrical contacts and a corresponding one of the plurality of surface connectors; and a first one of the plurality of lines intersects a second one of the plurality of lines at a first angle.

2. The device of claim 1 wherein the first angle is 90 degrees.

3. The device of claim 1 wherein the plurality of electrical contacts comprise bond pads.

4. The device of claim 1 wherein the plurality of surface connectors comprise conductive vias.

5. The device of claim 1 wherein the plurality of electrical contacts is disposed in a grid comprising evenly spaced rows and columns.

6. The device of claim 5 wherein each of the plurality of lines corresponding to electrical contacts in a first row intersect a line parallel to the first row at a second angle.

7. The device of claim 6 wherein the second angle is 45 degrees.

8. The device of claim 5 wherein:

each of the plurality of lines corresponding to a third group of electrical contacts in a first row intersect a line parallel to the first row at a second angle;

each of the plurality of lines corresponding to a fourth group of electrical contacts in the first row intersect the line parallel to the first row at a third angle different from the second angle;

the electrical contacts on the first row alternate between electrical contacts from the third group and fourth group of electrical contacts.

9. The device of claim 8 wherein the first angle is 45 and the second angle is −45 degrees.

10. The device of claim 5 wherein:

for a plurality of rows, each of the plurality of lines corresponding to electrical contacts in the plurality of rows intersects a line parallel to any of the plurality of rows at a second angle;

for a first row that is adjacent to one of the plurality of rows but is not one of the plurality of rows;

each of the plurality of lines corresponding to a third group of electrical contacts in the first row intersect a line parallel to the first row at a third angle;

each of the plurality of lines corresponding to a fourth group of electrical contacts in the first row intersect the line parallel to the first row at a fourth angle different from the third angle;

the electrical contacts on the first row alternate between electrical contacts from the third group and fourth group of electrical contacts.

11. The device of claim 10 wherein the second angle is 45 degrees and the third angle is −45 degrees.

* * * * *